United States Patent [19]

Nishitsuji et al.

[11] Patent Number: 5,227,323

[45] Date of Patent: Jul. 13, 1993

[54] METHOD OF MANUFACTURING CAPACITOR ELEMENTS IN AN INTEGRATED CIRCUIT HAVING A COMPOUND SEMICONDUCTOR SUBSTRATE

[75] Inventors: Mitsuru Nishitsuji; Hiromasa Fujimoto, both of Osaka, Japan

[73] Assignee: Matsushita Electric Industrial Co., Ltd., Osaka, Japan

[21] Appl. No.: 901,296

[22] Filed: Jun. 19, 1992

[30] Foreign Application Priority Data

Jun. 19, 1991 [JP] Japan .................. 3-147165

[51] Int. Cl.$^5$ .................. H01L 21/70
[52] U.S. Cl. .................. 437/47; 437/60; 437/919
[58] Field of Search .......... 437/47, 52, 60, 919, 437/192, 200, 195, 919; 257/296, 277, 311

[56] References Cited

U.S. PATENT DOCUMENTS 4,937,650  6/1990  Shinriki et al. .
5,108,941  4/1992  Paterson et al. .................. 437/919

FOREIGN PATENT DOCUMENTS 0094664  4/1988  Japan .................. 437/919
0166256  7/1988  Japan .................. 437/919
0011347  1/1989  Japan .................. 437/919
0218054  8/1989  Japan .................. 437/919
0119170  5/1990  Japan .................. 437/919
3-201558  9/1991  Japan .

*Primary Examiner*—Tom Thomas
*Attorney, Agent, or Firm*—Lowe, Price, LeBlanc & Becker

[57] ABSTRACT

A capacitor element is formed in an integrated circuit having a compound semiconductor substrate such as a GaAs substrate and having Schottky type FETs formed on the substrate, with the capacitor element being formed by a process in which a lower electrode of a capacitor element and a lower layer portion of the gate electrode of a FET are formed by the same processing step from a high melting-point tungsten compound, a film of insulating material having a high dielectric coefficient is formed overall and is patterned to expose the gate electrode lower layer, and a high-conductance metallic film is then deposited overall and patterned to form an upper electrode of the capacitor element and an upper layer portion of the gate electrode. Capacitor elements and FETs can thereby be formed in such an IC by a simple process, while substantial reduction of the substrate area occupied by each capacitor element can be achieved.

6 Claims, 3 Drawing Sheets

METHOD OF MANUFACTURING CAPACITOR ELEMENTS IN AN INTEGRATED CIRCUIT HAVING A COMPOUND SEMICONDUCTOR SUBSTRATE

BACKGROUND OF THE INVENTION

1. Field of the Invention

The present invention relates to a method of forming capacitor elements in an integrated circuit having a compound semiconductor substrate, and in particular to a method of forming highly miniaturized capacitor elements in an integrated circuit having a GaAs substrate on which are formed Schottky type field effect transistors (referred to in the following simply as FETs).

2. Description of the Related Art

FIGS. 1A and 1B are cross-sectional views to illustrate two prior art examples of configurations for a capacitor element which can be formed on a GaAs substrate of an integrated circuit. In FIG. 1A, an insulating film 4 functions as the dielectric layer of the capacitor element. The insulating film 4 also functions in general to provide electrical insulation between various connecting leads and electrodes of elements of the integrated circuit, these leads and electrodes having been formed by patterning processing of a single layer of a high-conductance material which is generally Au. For that reason, the insulating film 4 will be referred to as an inter-layer insulating film, to be distinguished from an insulating film portion which functions only as a dielectric layer of a capacitor element. In the manufacturing process for such a capacitor element (considering only the formation of a single capacitor element, for simplicity) a metallic film is formed overall on the main surface of the substrate by evaporative deposition and is then patterned to form a first electrically conducting film portion 2 which constitutes the lower electrode of the capacitor element. A film of electrically insulating material is then formed overall, and is patterned to form a through-hole therein for electrical connection to the first electrically conducting film portion 2. A film of a metal having high conductivity, e.g. Au, is then formed over the patterned electrically insulating film, and is patterned to define a second electrically conducting film portion 5 which lies directly over the first electrically conducting film portion 2 and constitutes the upper electrode of the capacitor element, and a third electrically conducting film portion 6 which is shaped to form a connecting lead for the first electrically conducting film portion 2 and is connected thereto via the through-hole in the electrically insulating film 4.

With the configuration of FIG. 1B, the dielectric layer of the capacitor element is formed of a different material (i.e. having a higher value of dielectric constant) from the inter-layer insulating film. In the manufacturing process for such a capacitor element, after first forming the first electrically conducting layer portion 2 as the lower electrode of the capacitor element, on the main surface of the GaAs substrate 1, an insulating film and a metallic layer are successively formed overall by evaporative deposition, then patterned by a photo-etching process to form an insulating film portion 4' as the dielectric layer of the capacitor element and a second electrically conducting film portion 5 as the upper electrode of the capacitor element. A film of electrically insulating material 9 is then formed overall, and is then patterned to form through-holes for connection to the first and second electrically conducting film portions 2 and 5. A metallic layer is then formed overall by evaporative deposition, and is patterned by etching to form a first connecting lead 5' which is coupled via a through-hole to the second electrically conducting film portion 5, and a second connecting lead 6 which is coupled via the other through-hole to the first electrically conducting film portion 2. A protective electrically insulating film 10 is then formed overall.

With a capacitor element having the configuration shown in FIG. 1A, the electrical properties required for an inter-layer insulating film of such an IC will be different from the optimum properties required for the dielectric layer of a capacitor element, and in particular the dielectric constant of the material used for the inter-layer insulating film will be insufficiently high. Hence in order to achieve a sufficiently high degree of capacitance for the capacitor element, it is necessary to make the thickness of the inter-layer insulating film extremely small. This leads to problems of low breakdown voltage levels and device failure.

In the case of a capacitor element having the configuration shown in FIG. 1B in which an electrically insulating film portion 4' is formed separately from the inter-layer insulating film 9, for use as the dielectric layer of the capacitor element, it becomes possible to select a material having a suitably high value of dielectric constant as the electrically insulating film portion 4'. However the problem then arises that it is necessary to perform a substantially greater number of manufacturing process steps than are required for the configuration of FIG. 1A, so that the manufacturing process becomes excessively complex.

However another problem arises with the configuration of FIG. 1B. In general, Au is used in the prior art as the material for the connecting leads 6, 5', and if that same material is also used to form the first electrically conducting film portion 2 as the lower electrode of the capacitor element, poor adherence will occur between the upper surface of that lower electrode and the electrically insulating film portion 4' if that electrically insulating film is formed of a material selected to obtain a high value of dielectric constant, and grain may be formed within the electrically insulating film. As a result it is found that the electrical insulation properties of the insulating film portion 4' are poor. Specifically, the breakdown electric field strength is low.

SUMMARY OF THE INVENTION

It is an objective of the present invention to overcome the problems of the prior art set out above by providing a method of manufacture for a capacitor element of an integrated circuit having a compound semiconductor substrate, whereby a dielectric layer of the capacitor element is formed as an electrically insulating film portion of a material having a suitably high value of dielectric constant such as TaOx or TiOx, but whereby deterioration of insulating properties of the dielectric layer of the capacitor element is prevented.

It is a further objective of the present invention to provide a method of manufacture for such a capacitor element whereby the number of manufacturing processing steps required to form the capacitor element is substantially reduced by comparison with the prior art.

It is moreover an objective of the present invention to provide a method of manufacture for such a capacitor element whereby a gate electrode of a field effect transistor of the integrated circuit can be formed during the manufacturing processing steps of forming the capacitor element.

More specifically, the present invention provides a method of forming a capacitor element of an integrated circuit formed upon a compound semiconductor substrate, comprising steps of:

(a) forming a first film of electrically conducting material over a main surface of the substrate, the material being a compound of tungsten, and executing patterning processing of the first electrically conducting film to form a first electrode of the capacitor element;

(b) forming a film of an electrically insulating material over the first electrode and the substrate surface, and executing patterning processing of the insulating film to substantially remove the insulating film from the substrate while leaving an insulating film portion covering the first electrode of the capacitor element and forming a through-hole in the insulating film portion; and (c) forming a second film of electrically conducting material over the insulating film portion and the substrate surface, the second film of electrically conducting material consisting of a metal having high electrical conductivity, and executing patterning processing of the second film of electrically conducting material to form a first portion thereof disposed over the insulating film portion to constitute a second electrode of the capacitor element, and a second portion thereof which is electrically connected via the through-hole to the first electrode, to constitute a connecting lead of the first electrode.

The invention further provides such a method of forming a capacitor element wherein during the step (a) of forming the first electrode of the capacitor element, a lower layer portion of a gate electrode of a field effect transistor is also formed upon the substrate surface, by the patterning processing of the first electrically conducting film, wherein during the step (b) of forming and patterning the insulating film a portion of the insulating film is removed from the lower layer portion of the gate electrode, and wherein during the step (c) of forming the upper electrode of the capacitor element, an upper layer portion of the gate electrode is formed upon the lower layer portion of the gate electrode, by the patterning processing of the second electrically conducting film.

With the method of the present invention, as described hereinafter referring to a specific embodiment, it becomes possible to form each FET gate electrode during the same manufacturing process steps in which the upper and lower electrodes of each capacitor element are formed, and only a small total number of steps are required in the process. In addition, due to the use of a high melting-point tungsten compound for the lower electrode of each capacitor element, on which is formed a film of material such as TaOx having a high value of dielectric constant, the breakdown electric field strength of that film is increased by comparison with the use of a material such as Au for the lower electrode, so that the thickness of the film can be made small and the capacitance per unit of area occupied by a capacitor element can be correspondingly increased.

DESCRIPTION OF PREFERRED EMBODIMENTS

Figure 1A:
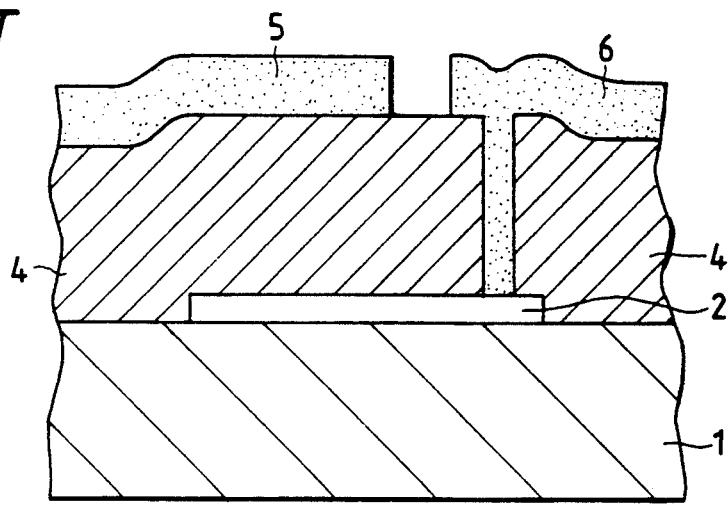
FIGS. 1A, 1B are cross-sectional views illustrating respective prior art examples of configurations for a capacitor element of an integrated circuit formed on a GaAs compound semiconductor substrate.
Figure 1B:
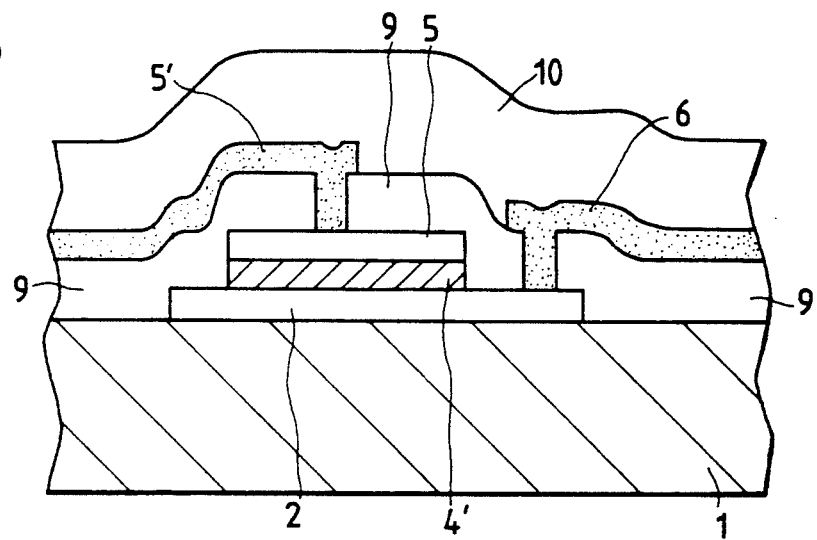
Figure 2:
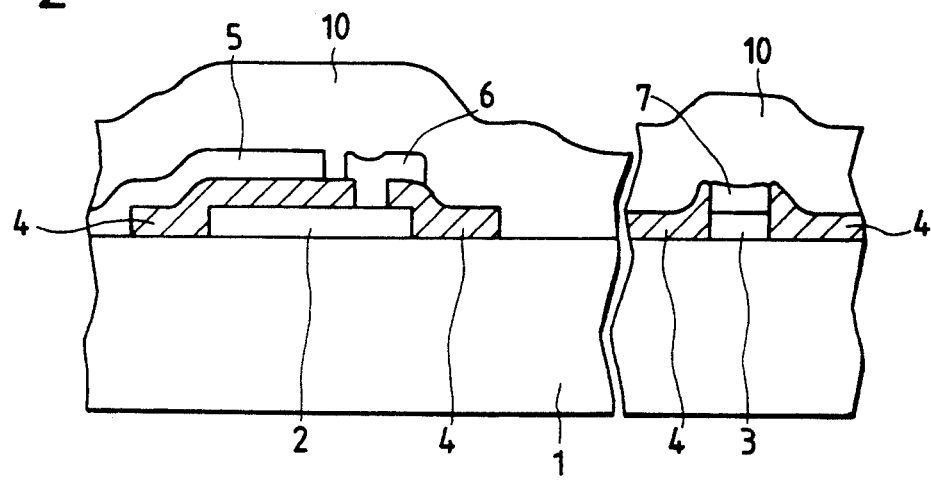
FIG. 2 is a cross-sectional view of an embodiment of a capacitor element according to the present invention which is formed on a GaAs substrate.
Figure 3A:
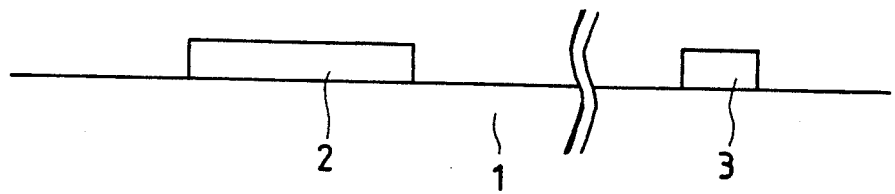
FIGS. 3(a)-(d) illustrate successive steps in the manufacturing of the capacitor element of FIG. 2, and illustrating formation of a gate electrode of a FET of the integrated circuit during the process of manufacturing of the capacitor element.
Figure 3B:
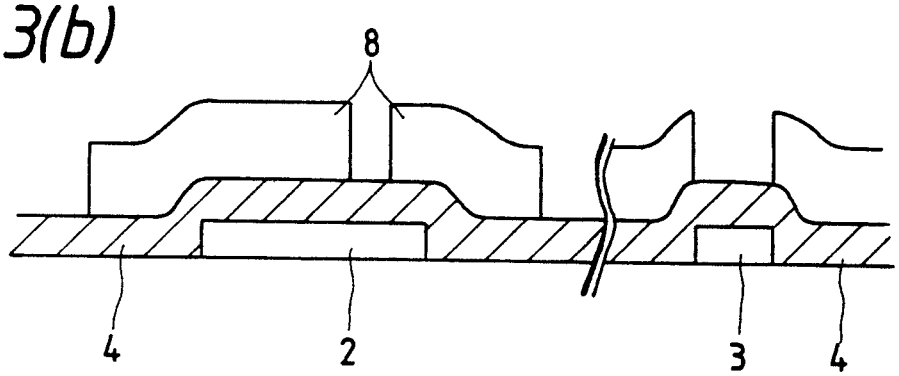
Figure 3C:
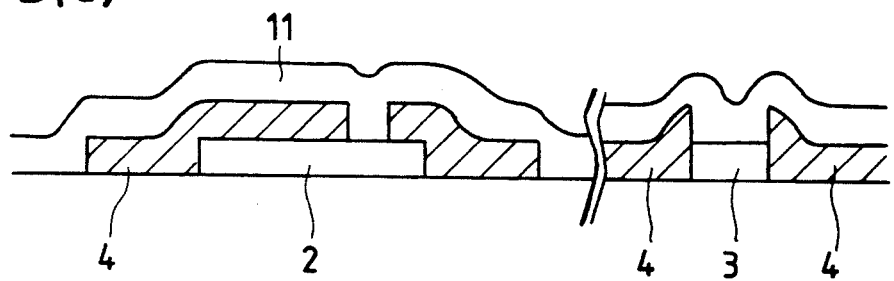
Figure 3D:
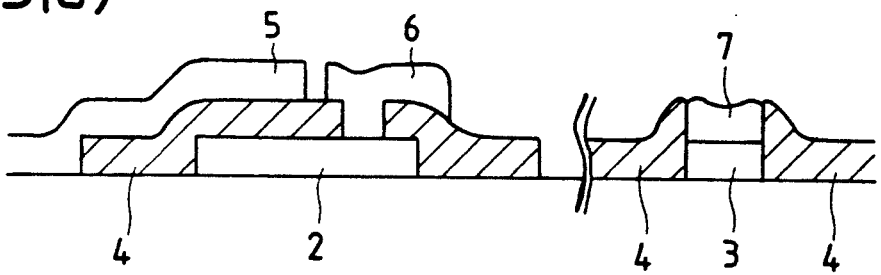

FIG. 2 is a cross-sectional view showing the configuration of an embodiment of a capacitor element formed by the method of manufacture of the present invention. In FIG. 2, parts which correspond in function to parts in the prior art examples of FIG. 1A, 1B are designated by identical reference numerals. The capacitor element is formed in an integrated circuit having a GaAs substrate 1 on which are also formed Schottky type FETs as described hereinabove. The lower electrode of the capacitor element is constituted by a first electrically conducting film portion 2, formed from a tungsten compound having a high melting point. In this embodiment, the tungsten compound is WSi. The first electrically conducting film portion 2 is separated from a second electrically conducting film portion 5 constituting the upper electrode of the capacitor element, and a third electrically conducting film portion 6 constituting a connecting lead for the lower electrode, by an electrically insulating film 4 formed of a material having a high dielectric constant, which in this embodiment is TaOx. Each of the second and third electrically conducting film portions 5, 6 is formed of Au in this embodiment. A gate electrode of a FET is formed of a lower electrically conducting film portion 3, formed of the same material and to the same thickness as the first electrically conducting film portion 2 of the capacitor element, and an upper electrically conducting film portion which is formed of the same material and to the same thickness as each of the second and third electrically conducting film portions 5, 6 of the capacitor element. As shown, portions of the electrically insulating film 4 are deposited around the sides of these layers 3, 7 which constitute the gate electrode of the FET. A protective layer 10 formed of an electrically insulating material is deposited overall.

The manufacturing process will be described referring to diagrams (a) to (d) of FIG. 3. Firstly, a film of WSi is formed to a thickness of 0.2 micron over a main surface of the GaAs substrate 1, by the usual sputtering method, then reactive ion etching is used to pattern the WSi film to form the lower electrically conducting film portion 3 of the FET gate electrode and the first electrically conducting film portion, i.e. lower electrode 2 for the capacitor element. Next, as shown in diagram (b), an electrically insulating TaOx film 4 is formed overall by sputtering to a thickness of 0.1 micron, then a resist mask 8 is formed thereon and reactive ion etching is executed through that mask to selectively remove portions of the electrically insulating film 4, to leave only a portion covering the top and side faces of the lower electrode 2 but with a through-hole formed in the electrically insulating film communicating with the lower electrode 2, and to remove the electrically insulating film 4 from the upper face of the lower electrically insulating film portion 3 of the gate electrode.

A film 11 of Au is then formed overall, to achieve the condition shown in diagram (c).

Next, a mask, resist and ion milling are utilized to selectively remove portions of the Au film 11 to obtain the configuration shown in diagram (d). The second electrically conducting film portion 5 consitituting the upper electrode of the capacitor element, the third electrically conducting film portion 6 constituting the connecting lead to the lower electrode 2, and the upper electrically conducting film portion 7 of the FET gate electrode are thereby formed. The protective film 10 is then formed overall, to obtain the final structure shown in FIG. 1.

Since the upper film portion 7 of the gate electrode is formed of Au, the electrical resistance of the gate electrode can be made low.

By comparison with the dielectric constant of 6.5 for SiN, which is typically used in the prior art as an inter-layer insulating film for such an integrated circuit, a value of dielectric constant of approximately 22 to 24 can be achieved by using an electrically insulating film formed of TaOx as in the above embodiment. Thus for specific values of electrically insulating film thickness between the upper and lower electrodes of the capacitor element and for the substrate area occupied by the capacitor element, a very much higher value of capacitance can be achieved with the method of manufacture of the present invention than is possible by using a material such as SiN. Alternatively stated, the invention enables the thickness and the substrate surface area occupied by each capacitor element to be substantially reduced, by comparison with a prior art method of manufacture which produces a configuration of the form shown in FIG. 1A In addition if the electrically insulating film thickness is reduced from a typical value of 0.2 micron used for a SiN insulating film to 0.1 micron, then the substrate surface area occupied by each capacitor element can be made only 1/6 of the area required in the case of an SiN film being used as the dielectric layer of the capacitor element.

Figure 4:
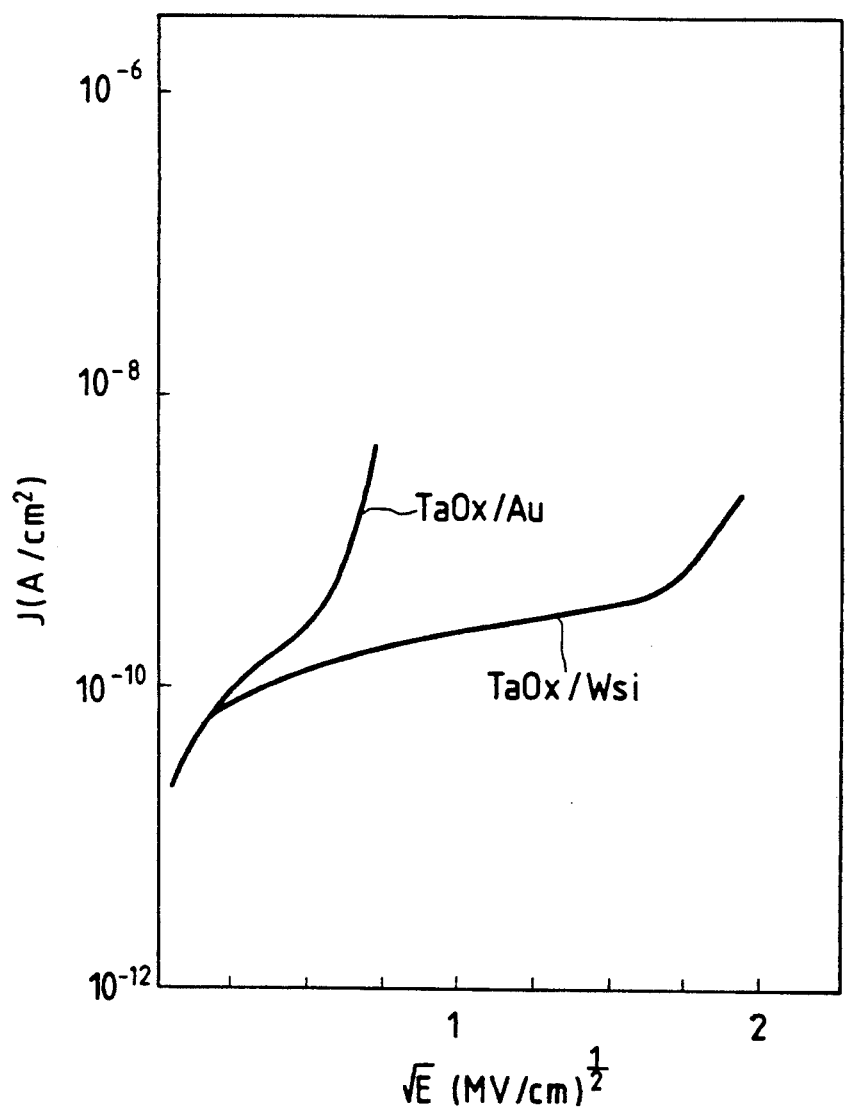
FIG. 4 illustrates relationships between electric field strength and current flow through a capacitor element, for the cases of the lower electrode of the capacitor element being formed of Au and WSi respectively, with the dielectric layer of a capacitor element being formed of TaOx.

However in addition, the use of a material such as WSi for the lower electrode of the capacitor element, rather than Au, enables the breakdown electric field strength of the capacitor element to be substantially increased. This point is illustrated in FIG. 4, which shows the relationships between applied electric field and resultant current flow between the electrodes, for the cases of the the lower electrode of the capacitor element being formed of Au and being formed of WSi, respectively, with the dielectric layer of the capacitor element being formed of TaOx. When WSi is used, the breakdown electric field strength is approximately 3.5 MV/cm, whereas when Au is used the breakdown electric field strength is only approximately 0.5 MV/cm. Thus, it becomes possible to form the electrically insulating film of the capacitor element to a smaller value of thickness, when WSi is used, by comparison with the use of Au for the lower electrode. Hence, a higher value of capacitance per unit of substrate area occupied can be achieved.

Another advantage provided by the method of manufacture of the present invention is a simple process with a small number of processing steps. With a prior art method of manufacture for forming a capacitor element with an inter-electrode electrically insulating film that is different from the inter-layer insulating film, as in the configuration of FIG. 1B, it is necessary to execute a minimum of 6 layer deposition processing steps (including forming a protective film) and 4 steps of patterning the deposited layers. With the present invention on the other hand, similar results are achieved with a total of only 4 layer deposition processing steps and 3 steps of patterning the layers.

In the embodiment described above, WSi is used as the material for the lower electrode of the capacitor element. However it would be equally possible to use WSiN or WN, with similar results being obtainable.

Moreover the above embodiment has been described for the case of TaOx being used as the electrically insulating film material for the capacitor element. However it would be equally possible to use SrTiOx as the electrically insulating film material, with similar results being obtainable.

The advantages obtained by the method of manufacture of the present invention can be summarized as follows:

(a) By using a tungsten compound having a high melting point as the material for the lower electrode of the capacitor element, formed on the GaAs substrate surface, it becomes possible to form that lower electrode at the same time and in the same step of the manufacturing process as formation of a lower layer portion of a gate electrode of a Schottky type of FET on the GaAs substrate. In addition, it becomes possible to form a metallic layer portion constituting the upper electrode of the capacitor element in the same processing step as formation of an upper layer portion of the gate electrode to thereby reduce the electrical resistance of the gate electrode. Moreover by using a tungsten compound rather than Au as the material of the lower electrode of the capacitor element, the breakdown electric field strength of the capacitor element is increased, so that the dielectric layer of the capacitor element can be made thinner than in the case of Au being used for the lower electrode. Thus for a given value of substrate surface area occupied by the capacitor element, a higher value of capacitance can be achieved than would be possible if Au were to be used.

(b) With the method of manufacture of the present invention, since the dielectric layer of the capacitor element is formed of TaOx, TiOx, or SrTiOx, a high value of dielectric constant can be achieved so that the substrate surface area occupied by the capacitor element can be further reduced.

(c) The above advantages, whereby the substrate surface area occupied by the capacitor element is reduced by comparison with the prior art, are achieved without requiring a large number of manufacturing process steps.

What is claimed is:

1. A method of forming a capacitor element of an integrated circuit formed upon a compound semiconductor substrate, comprising steps of:
   (a) forming a first film of electrically conducting material over a main surface of said substrate, said material being a compound of tungsten having a high melting-point, and executing patterning processing of said first electrically conducting film to form a first electrode of said capacitor element;
   (b) forming a film of an electrically insulating material over said first electrode and said substrate surface, and executing patterning processing of said insulating film to substantially remove said insulating film from said substrate while leaving an insulating film portion covering said first electrode of the capacitor element and forming a through-hole in said insulating film portion; and (c) forming a second film of electrically conducting material over said insulating film portion and said substrate surface, said second film of electrically conducting material consisting of a metal having high electrical conductivity, and executing patterning processing of said second film of electrically conducting material to form a first portion thereof disposed over said insulating film portion to constitute a second electrode of said capacitor element, and a second portion thereof which is electrically connected via said through-hole to said first electrode, to constitute a connecting lead of said first electrode.

2. A method of forming a capacitor element of an integrated circuit according to claim 1, wherein during said step (a) of forming said first electrode of the capacitor element, a lower layer portion of a gate electrode of a field effect transistor is also formed upon said substrate surface, by said patterning processing of said first electrically conducting film, wherein during said step (b) of forming and patterning said insulating film a portion of said insulating film is removed from said lower layer portion of the gate electrode, and wherein during said step (c) of forming said upper electrode of the capacitor element, an upper layer portion of said gate electrode is formed upon said lower layer portion of the gate electrode, by said patterning processing of said second electrically conducting film.

3. A method of forming a capacitor element of an integrated circuit according to claim 1, wherein said electrically insulating material is selected from a group of materials consisting of TaOx, TiOx, and SrTiOx 4. A method of forming a capacitor element of an integrated circuit according to claim 1, wherein said first electrically conducting film is formed of a material selected from a group of materials consisting of WSi, WSiN and WN.

5. A method of forming a capacitor element of an integrated circuit according to claim 2, wherein said electrically insulating material is selected from a group of materials consisting of TaOx, TiOx, and SrTiOx.

6. A method of forming a capacitor element of an integrated circuit according to claim 2, wherein said first electrically conducting film is formed of a material selected from a group of materials consisting of WSi, WSiN and WN.

* * * * *